United States Patent [19]

Cooper

[11] Patent Number: 4,829,257

[45] Date of Patent: May 9, 1989

[54] METHOD AND APPARATUS FOR CONTINUOUSLY SHIFTING PHASE OF AN ELECTRONIC SIGNAL

[76] Inventor: J. Carl Cooper, 1373 Sydney Dr., Sunnyvale, Calif. 94087

[21] Appl. No.: 16,923

[22] Filed: Feb. 20, 1987

[51] Int. Cl.⁴ .......................... H03K 9/06; H03K 5/00
[52] U.S. Cl. ................................... 328/133; 328/109; 328/155; 307/262; 307/513
[58] Field of Search ..................... 307/262, 513, 511; 328/109, 133, 55, 155

[56] References Cited

U.S. PATENT DOCUMENTS

| | | | |
|---|---|---|---|
| 3,188,490 | 6/1965 | Hoff, Jr. | 307/202 |
| 3,277,362 | 10/1966 | Elliott, Jr. | 307/262 |
| 3,299,318 | 1/1967 | Schutte | 307/262 |
| 3,621,406 | 11/1971 | Paine et al. | 328/155 |

Primary Examiner—Stanley D. Miller
Assistant Examiner—Richard Roseen
Attorney, Agent, or Firm—Woodling, Krost & Rust

[57] ABSTRACT

An improved device for accurately phase or frequency shifting an input signal is disclosed incorporating a variable resistor extending between at least two known phase shifted values of said input signal.

25 Claims, 7 Drawing Sheets

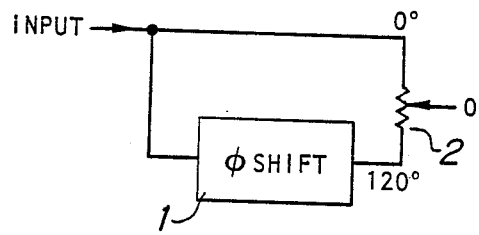
Figure 1A
PRIOR ART
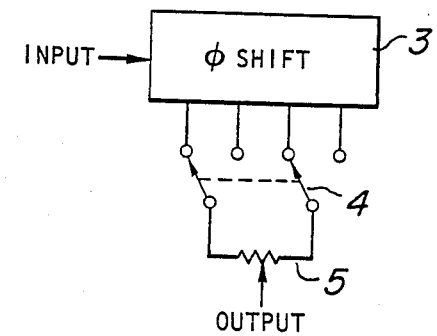
Figure 1B
PRIOR ART
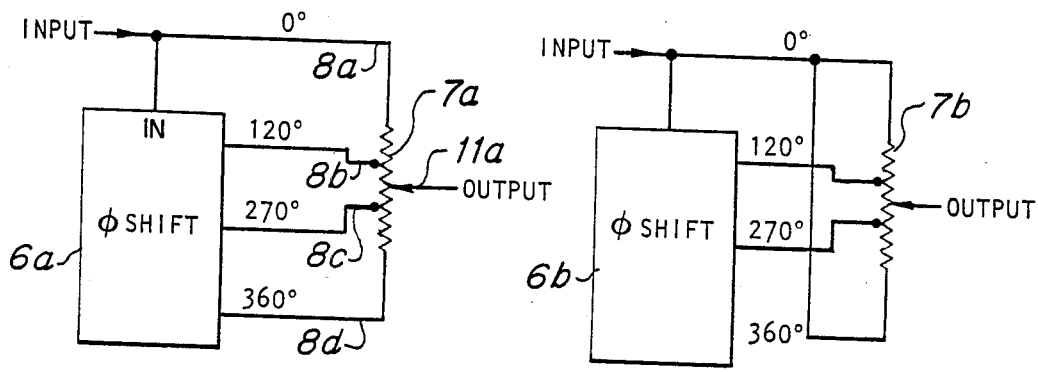
Figure 2
Figure 3

TYPICAL WAVEFORMS FOR FIGURE 4

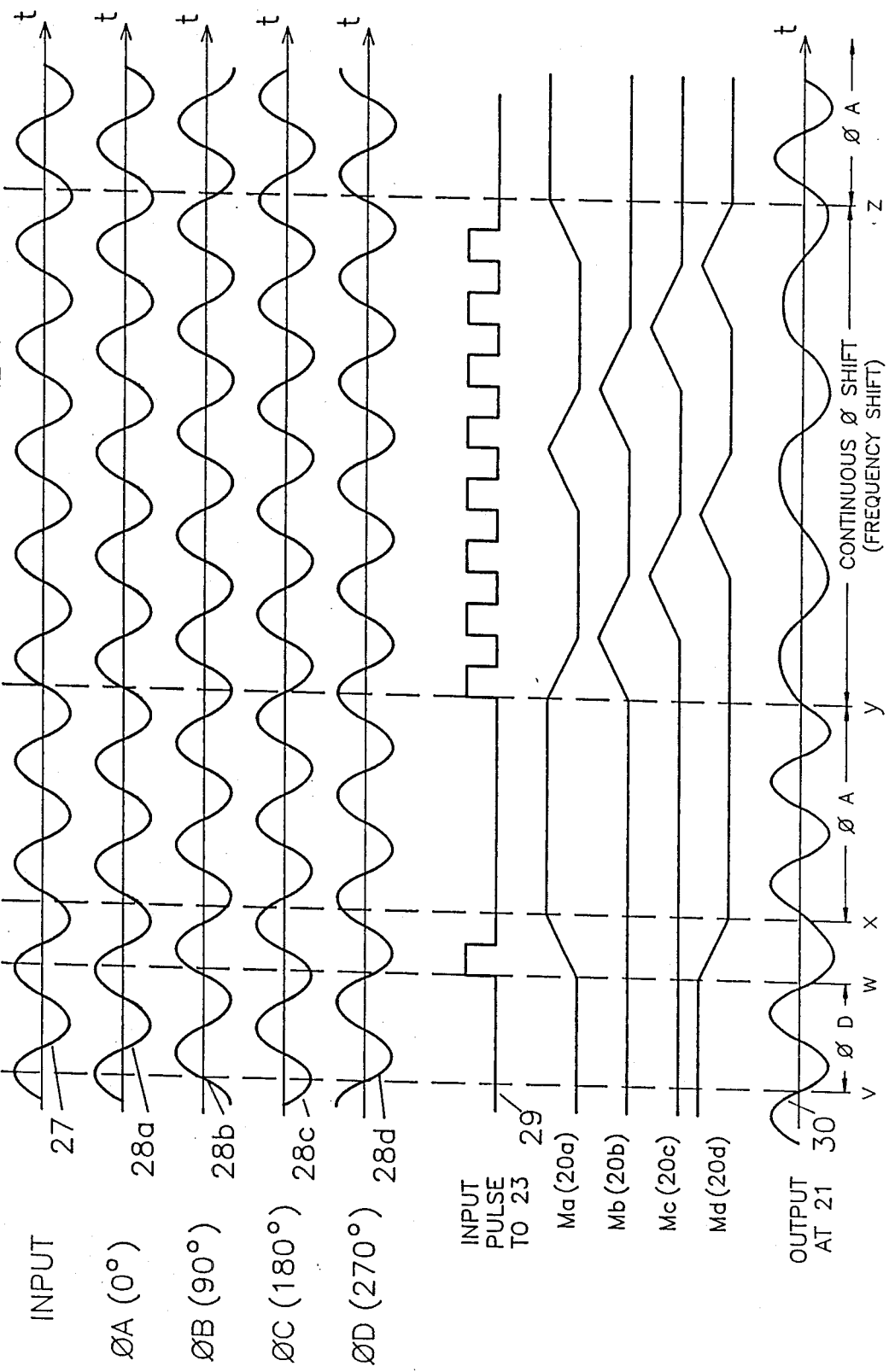

METHOD AND APPARATUS FOR CONTINUOUSLY SHIFTING PHASE OF AN ELECTRONIC SIGNAL

BACKGROUND OF THE INVENTION

1. Field of the Invention

This invention relates to a method an apparatus for providing a continuously adjustable phase shift to an electronic signal.

2. Description of the Prior Art

Many methods of continuously phase shifting an electronic signal are known. Of the known methods, those which are capable of phase shifting a signal 180 degrees or more utilize cascaded stages which are each adjusted, or otherwise utilize expensive variable inductive or capacitive components, such as tapped delay lines.

Other methods of continuously shifting phase of a signal have utilized a variable resistor (pot) such as shown in FIG. 1. The phase shift is accomplished by applying different phases of the signal to each end of the variable resistor, which allows a given phase between the two applied phases to be selected by in effect mixing a portion of each of the applied signals. Unfortunately, if the applied phases differ by 180 degrees the two components will exactly cancel thereby eliminating the output signal. More than 180 degree adjustment is not possible with this arrangement, as the application of fixed phases of more than 180 degrees will add vectorially giving a range of less than 180 degrees. The aforementioned problem can be eliminated by various switching arrangements, one of which is shown in FIG. 1, however this adds more expense, and requires that a switch be adjusted in addition to the pot.

A device called a goniometer solves all of the above problems quite nicely by providing a rotating coil inside of three or more stationary coils, the stationary coils being driven with different phases of the input signal. Thus, the rotating coil provides different output phases by being rotated to the appropriate position in proximity to the stationary coils. Unfortunately the cost of a goniometer is relatively high due to the coil construction, and the problem of coupling the output of the rotating coil member to the outside via slip rings or rotary transformer.

Other solutions to the problem include various electronic circuits such as phase locked loops, all pass filters and electronically variable delays, all of which are relatively complicated and expensive.

SUMMARY OF THE INVENTION

The present apparatus and method for continuously shifting the phase of an electronic signal provides a resistive component having three or more primary connective means for receiving different fixed phases of the electronic signal which resistive component also has an adjustable connective means which may be adjusted in its relative proximity to the primary connective means. Said resistive component may be continuous, allowing the adjustable connective means to be adjusted, in the same direction, past a given primary connective means a multiple number of times.

Other objects and a fuller understanding of this invention may be had by referring to the following description and claims, taken in conjunction with the accompanying drawings, in which:

FIGS. 1A and B are diagrams showing two prior art devices;

FIG. 2 is a diagram of a first embodiment of the invention;

FIG. 3 is an alternate embodiment of FIG. 2;

FIG. 10 shows typical waveforms for the circuit of FIG. 7.

DESCRIPTION OF THE PREFERRED EMBODIMENTS

Figure 4:
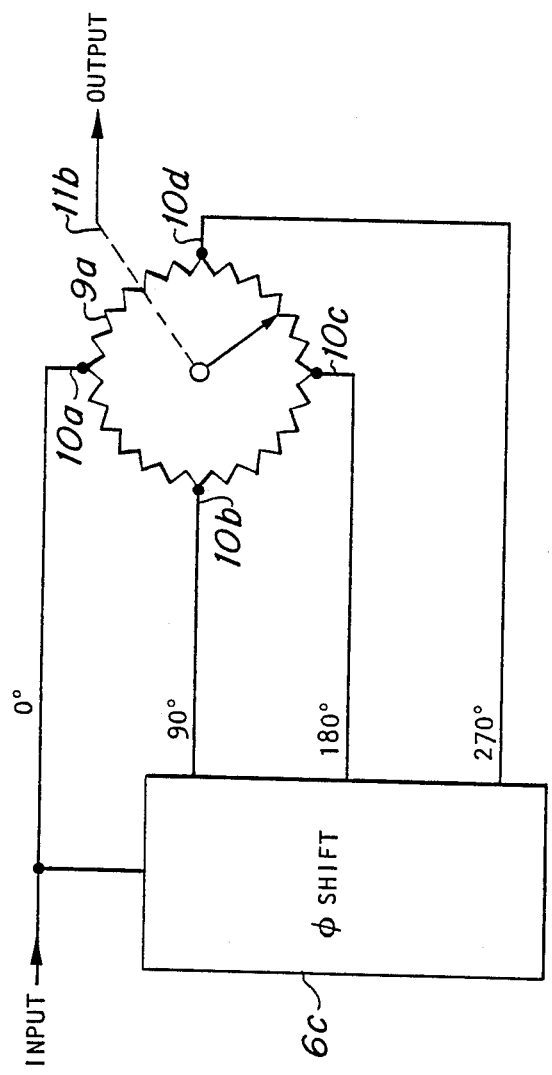
FIG. 4 is a diagram of a second embodiment of the invention.

FIG. 1 is a diagram of two prior art devices to provide a phase shift to an input signal, the first device having a fixed phase shifter 1 operating on an input signal, and a variable resistor 2 operating to provide an output signal which is a mixture or combination of the input and phase shifted input signal. The second prior art device of FIG. 1 contains a fixed phase shifter 3, a switch 4 and a variable resistor 5, which variable resistor provides an output which is a mixture of phase shifted signals from 3 which have been selected by 4.

FIG. 2 shows a first embodiment of the present invention having a fixed phase shift means 6A having an input responsive to the input signal and having three outputs, and a resistive component portion element or means 7A having four primary connective means 8a through 8d respectively, responsive to the input signal and the three outputs of the phase shifter respectively, the resistive means also having a variable connective means 11A, providing an output which is made up of portions of one or more of the signals applied to the four primary connective means.

FIG. 3 shows an alternate embodiment of FIG. 2 having a phase shifter 6B having two instead of three outputs, and a resistive means 7B corresponding to 7A.

FIG. 4 shows a second embodiment of the present invention having a phase shifter means 6C similar to FIG. 6A of FIG. 2, and an inventive resistive means 9A of a continuous configuration, having four primary connective means 10a through 10d respectively, corresponding to 8a through 8d, and a further variable connective means 11B, corresponding to 11A, the variable connective means providing an output made up of portions of one or more of the signals applied to the four primary connective means.

Figure 5:
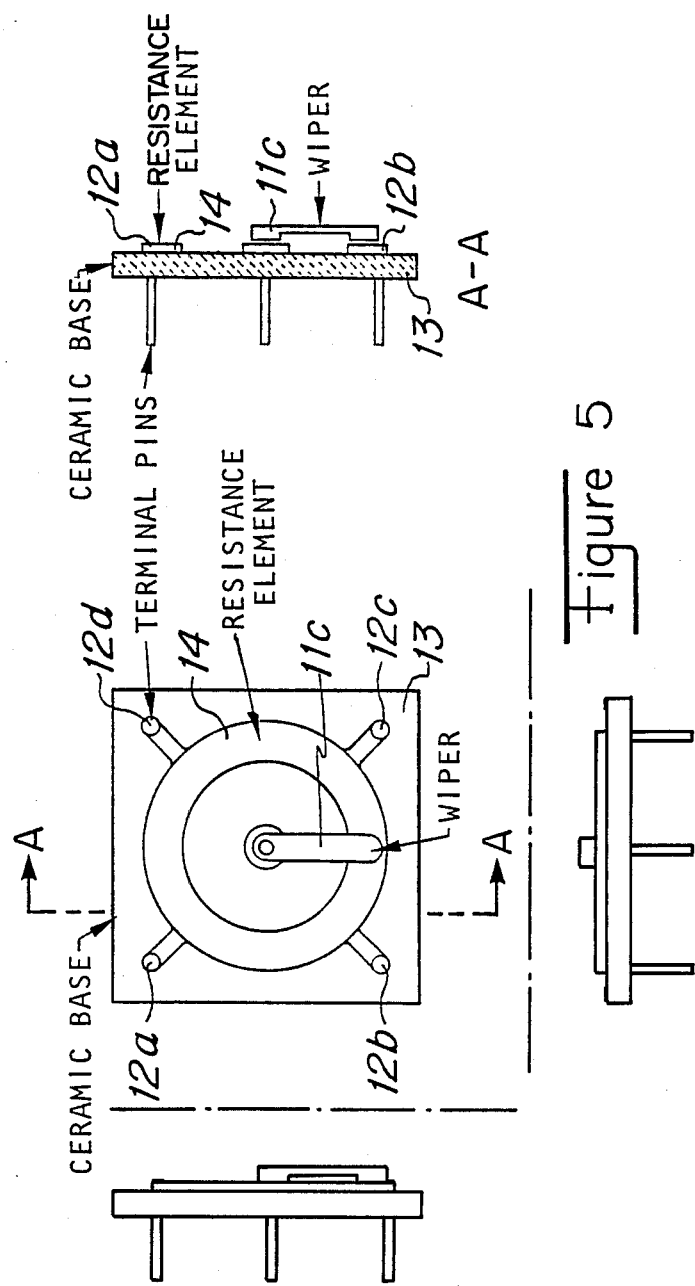
FIG. 5 is a mechanical drawing of an embodiment of means 9.

FIG. 5 shows a mechanical drawing of an embodiment of inventive means 9A of FIG. 4, showing a ceramic substrate 13, connective means 12a through 12d, resistive means 14 and adjustable connective means 11C.

Figure 6:
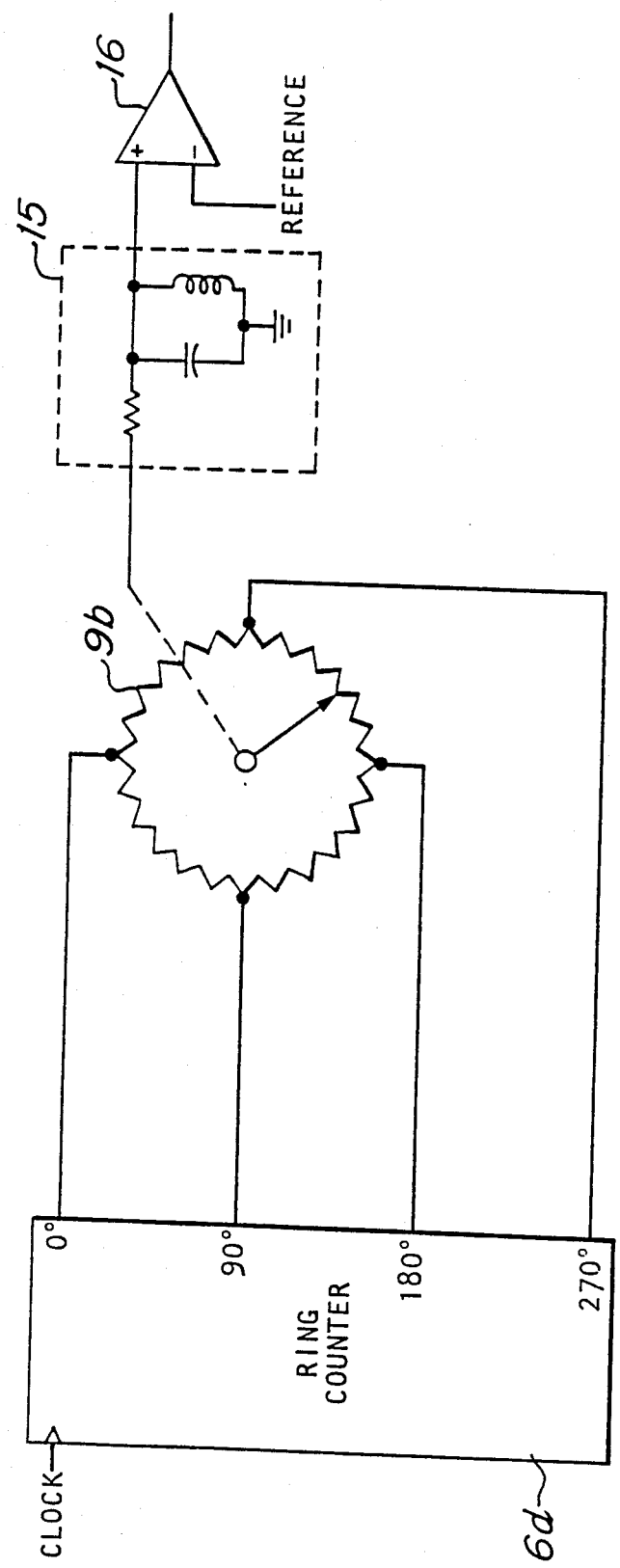
FIG. 6 is a further embodiment of the invention of FIG. 4.

FIG. 6 shows a further embodiment of the invention having a ring counter type of phase shifter 6D, resistive means 9B the same as 9A of FIG. 4, resonant circuit 15, and comparator 16.

Figure 7:
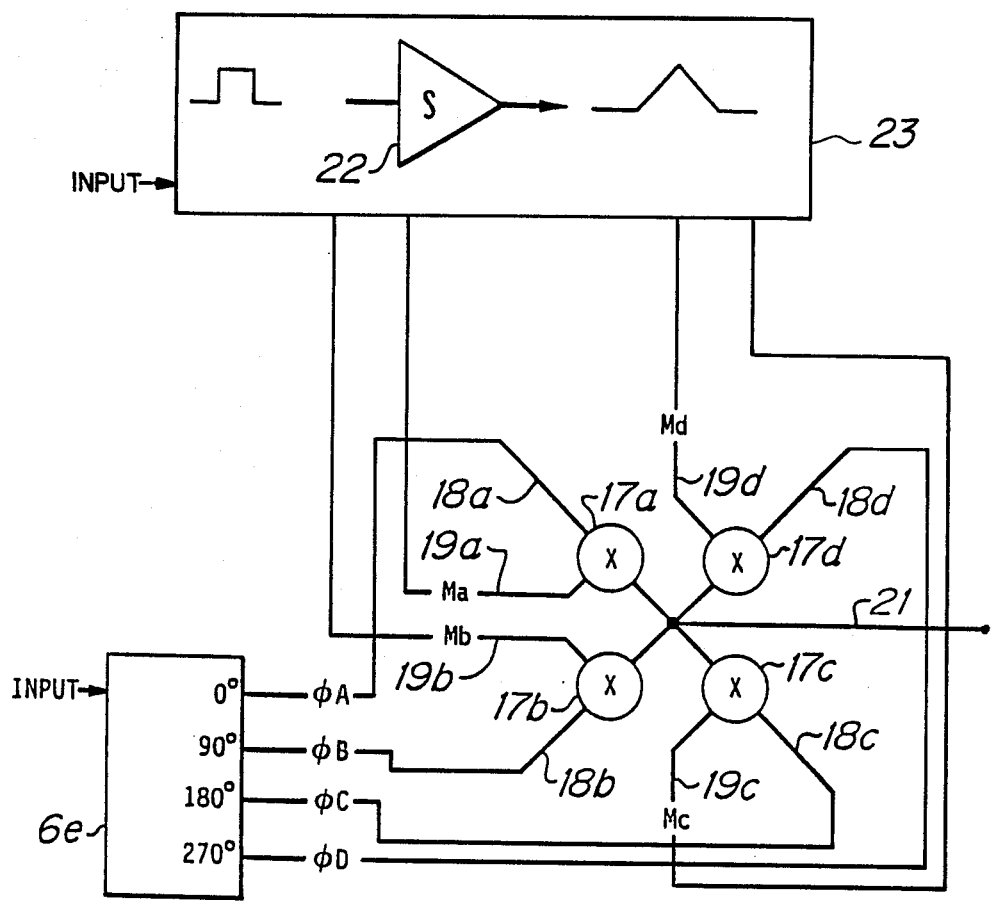
FIG. 7 is an all electronic embodiment of the invention of FIG. 4.

FIG. 7 shows still a further embodiment of the invention having a multiplier cluster composed of multipliers 17a through 17d, each having inputs 18a through 18d and 19a through 19d respectively, and having a common output 21, with four signal phases φA through φD shown connected to 18a through 18d respectively, which signal phases are provided by phase shifter 6E similar to 6C, and showing one method of generating waveforms 20a through 20d with a leaky integrator 22. Control element 23 provides control signals Ma-Md for controlling multipliers 17a-17d in response to an input. The control signals are provided such that the multipliers cause the applied signal to be turned on and off in a particular sequence and manner which will become apparent from the disclosure herein.

Figure 8:
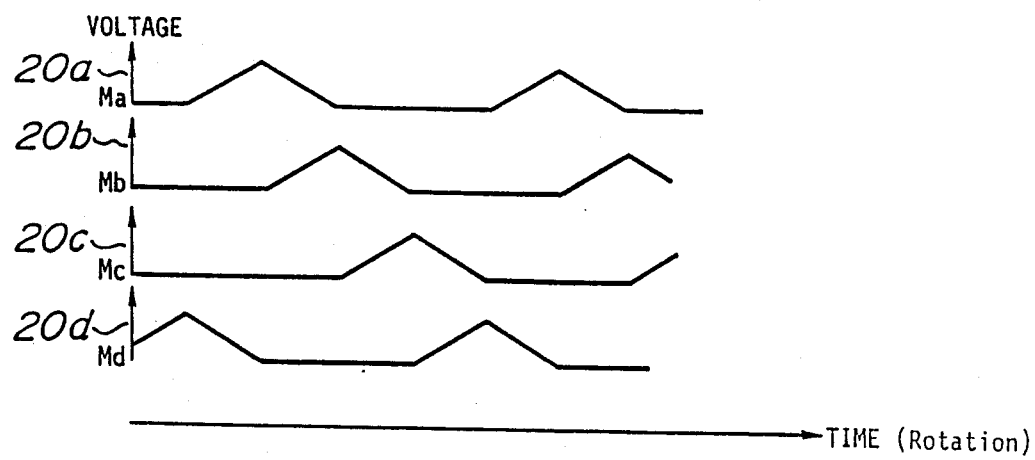
FIG. 8 is a set of waveforms showing typical control voltages of FIG. 7.

FIG. 8 shows typical waveforms 20a thru 20d which would be produced by control element 23 of FIG. 7, and particularly demonstrating the time relationship between the multiplier control voltages Ma thru Md versus time or versus rotation which are shown by way of example.

Figure 9:
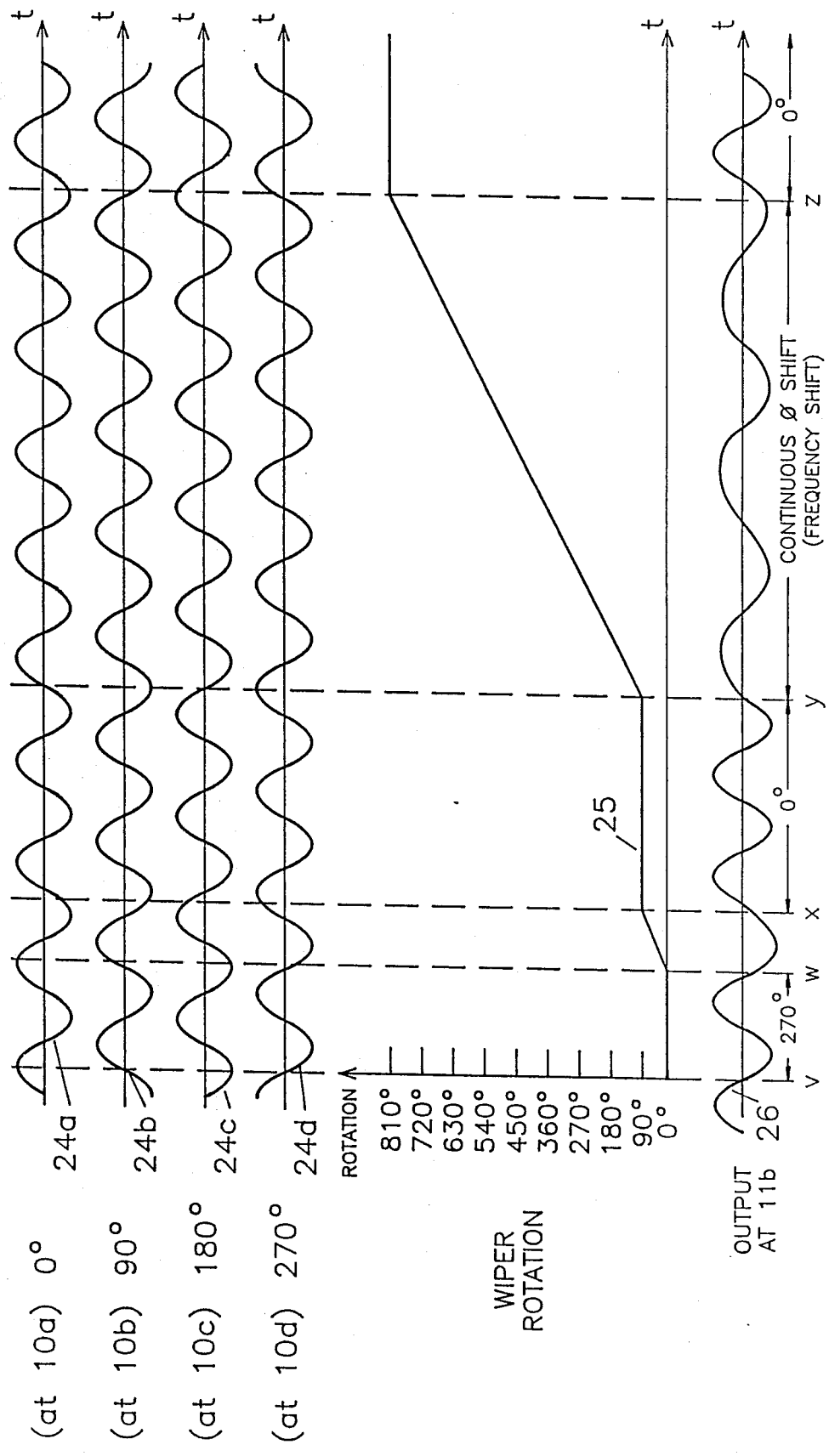
FIG. 9 shows typical waveforms for the circuit of FIG. 4.

FIG. 9 shows typical waveforms for FIG. 4, including phase shifted signal waveforms 24a-24d, wiper rotation graph 25 and output waveforms 26.

FIG. 10 shows typical waveforms for FIG. 7 including: input waveform 27, phase shifted signal waveforms 28a-28d, pulse input 29, control signal waveforms 20a-20d, and output signal waveform 30.

Referring to FIG. 2, the input signal is applied to a primary connective means 8a at one end of the resistive means, with phase shifted versions of the input signal which are provided by the phase shift means 6A being applied in sequence to the remaining primary connective means 8b, 8c and 8d of the resistive means. The respective phases of the preferred embodiment of FIG. 2 being labeled by way of example. One skilled in the art will recognize that if the phases of the applied signal are all equally spaced, and the various primary connective means on the resistive means equally spaced, the phase of the output signal will be linearly dependent on the position of the variable connective means of the resistive means. For the phases given by way of example, a full 360 degrees of phase adjustment is provided. It will also be recognized that this phase control will be linear, providing the phase shifter outputs are of the proper phase, the primary connective means are properly placed, and the resistive means properly linear. While for convenience it is sometimes desirable to have such linearity of control of output phase, there is no such requirement for the operation of the present invention, and in fact such parameters as the phase of the output signals from 6A, the placement of the primary connective means on 7A and the linearity of 7A itself may differ from the suggested values by a significant amount, such differences not affecting basic operation of the invention.

One skilled in the art will recognize that under certain circumstances it will be desirable to build such differences into the invention. For example, if very fine resolution in the area of 180 degrees is desired, the 120 degree output could be changed to 150 degrees and the 270 degree output changed to 240 degrees. The same effect can also be had by changing the location of those primary connective means 8b and 8c corresponding to 120 and 270 degrees. There is also no limitation on the number of primary or variable connective means to be used, as will be apparent to one skilled in the art, however four primary and one variable connective means will normally be adequate.

FIG. 3 shows an alternate embodiment of FIG. 2. Since the bottom connective means 8d of 7A is connected to the 360 degree output of 6A, for repetitive signals such as a CW sine wave, this 360 degree signal is the same as the 0 degree or input signal, accordingly, the bottom connective means 8d can be directly connected to the input.

FIG. 4 shows another embodiment of the invention which has a continuous resistive means 9. The continuous resistive means will allow the variable connective means 11B to select any phase of output signal while being adjusted in one direction only. For example, the embodiment of FIG. 2 must have the variable connective means moved across almost the entire resistive means to change from an output phase of 2 degrees to an output phase of 359 degrees. The embodiment of FIG. 4 only requires a small movement. The ability to continuously shift the phase of the output signal without reversing the direction of adjustment being a significant advantage of the embodiment of FIG. 4.

The continuous adjustment advantage of FIG. 4 also has another use, that of frequency shifting the input signal. If the variable connective means 11B is caused to traverse the entire resistive means at a given rate, then the instant frequency of the output is the sum of the input frequency and the variable connective means frequency, i.e. if the input frequency is 1000 Hz and the variable connective means is rotated at 5 Hz, the output frequency will be 1005 Hz. This fact can be very useful in building frequency synthesizers or frequency modulators. By way of explanation, this operation contrasts a known circuit which utilizes a motor driven variable capacitor to tune an oscillator. The oscillator frequency is caused to alternately increase and decrease as the capacitor plates are opened and closed by the motor. This oscillator generates a frequency which is responsive to the instant position of the motor shaft. If a motor were connected to the present invention of FIG. 4, the output frequency would be responsive to the instant frequency of rotation of the motor shaft.

It may be noted that the resistive means 9A has four primary connective means 10a through 10d, rather than the minimum three which would be required. The reason for four is that the required phase angles of the applied signals are 90 degrees apart, which is very easy for the phase shifter 6C to generate, as compared to the 120 degree difference required for three primary connective means. The added cost of the extra connective means is therefor made up by the lower cost of the phase shifter 6C. Also, many oscillators have available quadrature outputs which would be suitably applied for such connective means.

FIG. 9 shows typical waveforms for the circuit of FIG. 4. 24a-d shows four phases of an electronic signal in amplitude versus time plots. A graph of typical wiper rotation of the circular resistive means is shown in 25 and an amplitude versus time plot of the output from 11b, is shown at 26. Plots 24, 25 and 26 have the same time scale, and time points V, W, X, Y and Z have been identified by dashed lines. At time V the wiper is at the 0° position (not to be confused with the 24a 0° phase) which is chosen for the purpose of explanation, to be located at 10d, therefore, the 270° signal is passed to 11b. At time W the wiper rotates CCW until time X, causing the 0° signal to be output.

At time Y, the wiper again rotates CCW providing a continuous phase shifted output signal until time Z. Note that the continuous phase shift to the output signal causes the frequency of the output signal to change. In the present example, the wiper rotated CCW, thus decreasing the frequency of the output signal. Had the wiper rotated CW instead of CCW, the frequency would have increased.

The individual components required to build the embodiments of FIG. 2 or FIG. 3 are readily available to one skilled in the art. The phase shifter 6A or 6B can be made of a tapped fixed delay line having delay times between taps corresponding to the desired phase shift. The resistive means 7A (7B) is a commercially available component referred to as a tapped potentiometer.

The phase shift means 6C of FIG. 4 can be constructed from a tapped delay line as was 6A, but since the preferred phase angle between outputs is 90 degrees, tank circuits or active components can be utilized. Of particular interest is a digital system utilizing a master frequency which is divided by four in a ring or other counter, thus providing a signal at one fourth the frequency of the master, having all four phases available. This system is of considerable interest in the particular application of deriving the color subcarrier for the NTSC television system. The four times color subcarrier frequency is frequently used by television equipment manufacturers in their equipment, and thus readily available. Dividing the four times frequency by 4 to provide four quadrature signals for application to the resistive means 9A of FIG. 4, is an easy task, thus cheaply developing a color subcarrier of continuously adjustable phase. This method is of great commercial value.

The resistive means 9A of FIG. 4 is considered one of the inventive concepts of this application. It is believed that it is not presently known in the industry, or that it would have any practical use, other than that disclosed herein, if it were. Fortunately the means 9A of FIG. 4 is similar to 7A of FIG. 2, and it would be relatively easy for manufacturers of potentiometers to build a device which could be used for the means 9A.

Refer to FIG. 5, which is a mechanical drawing of an inventive embodiment of means 9A of FIG. 4. This continuous resistive means 9A for example, could be made of a ceramic substrate 13 with a circular deposit of conductive plastic or carbon film 14, as is presently done in the industry, except that the circular deposit 14 would be continuous, not broken. The circular deposit 14 would have four metallic contacts 12a through 12d, spaced at nominally 90 degrees, to make up the primary connective means of the resistive means, the contacts being of the same type now being used for potentiometers. The adjustable contact 11C would be the same as the wiper contact currently used in the industry.

It has been assumed for purposes of explaining the present invention that the phase shift means 6A, 6B and 6C are fixed. There is however no requirement of this in the present invention. As will be apparent to one skilled in the art, it would be possible to use variable phase shifters, or even to use an oscillator or other signal source. Further, the present invention could be used for any of the phase shifters, thus cascading devices.

The primary connective means and the variable connective means of the resistive means 7A and 9A as they have been described can be mechanical, however, there is no such restriction necessary for the operation of the present invention, and such connective means can as well be made and adjusted by non-mechanical means, including but not limited to optical. In particular, analog resistors, such as transistors and field effect transistors, photo resistors, and the like can be utilized as part of the resistive means, one embodiment of which is shown in FIG. 7. Various multiplier circuits and devices could also be used. The multiplier devices would be configured to pass a portion of the applied phase shifted signal by, in effect, varying the impedance from the input to output terminal in response to a control element. In the use of multipliers, a portion may well be an amount greater than the input, due to the presence of a gain stage in conjunction with the multiplier. It will be apparent to one skilled in the art that the operation of the multiplier may or may not include a gain stage, and that the description and claim of portions or percentages of signals is intended to cover operation with or without such gain.

FIG. 6 shows an embodiment of the invention which uses a digital ring counter 6D for the phase shifter. The four digital outputs of the ring counter are applied to the continuous resistive means 9B as in FIG. 4. The output of 9B is applied to a resonant circuit 15 which removes a substantial portion of the harmonic energy present on the signal due to the digital ring counter. The output of the resonant circuit, which is a sine wave, is applied to the input of a comparator 16. The other input of the comparator is a reference voltage which corresponds to the zero crossing voltage of the sine wave. The output of the comparator 16 is then a square wave which has a 50% duty cycle, and of course, this square wave may be a digital level signal.

FIG. 7 shows an embodiment of the invention of FIG. 4 where the mechanical resistive means 9A has been replaced with a group of electronic multipliers 17a through 17d. Various multiplier circuits are well known in the art. The Motorola MC 1494 and MC 1495 IC's are to well known components which can be utilized in implementing this multiplier function. The multipliers are identical in operation. Each has an input 18a through d for its respective phase shifted signal from phase shifter 6E. That phase shifted signal is multiplied by a control voltage Ma-Md provided by control element 23 which control voltage controls the percentage of its applied phase shifted signal φ which is passed by the multiolier to the common output 21. At any instant, one or two multipliers are active in order to provide a portion of one or two of the phase shifted signals to the common output 21. One skilled in the art will recognize that this operation is the same as that provided by 9A of FIG. 4, except that there are no mechanical parts to be turned, so that the selection of the output phase is provided by purely electronic means. The use of electronic means makes available very high speed and long life operation, unlike the mechanical means which is limited in speed and life by the quality of the mechanical parts.

FIG. 8 also shows typical waveforms 20a through 20d of the control voltages Ma-Md with respect to equivalent rotation as referenced to the equivalent FIG. 4, or time with respect to the addition of two frequencies. A method of generating one of the control waveforms with a leaky integrator 22 is also shown. The input to the leaky integrator is a square wave which could be generated with a ring counter such as 6D of FIG. 6. The integrator output would ramp up while the square wave is present, and ramp (or leak) down when the square wave goes away. Using four leaky integrators one each on the four outputs of 6D will provide the four control waveforms Ma-Md required. Various other types of ramp generator circuits are well known in the art, and could be used for the ramp generating function. While shown specifically in an analog embodiment, it will be understood by one skilled in the art that digital implementations of any or all of the above described functions and means can be utilized. Mechanical or electronic embodiments of the various functions can also be utilized, for example: the claimed portion means may be comprised of a mechanically resistive embodiment, such as that of FIG. 5, or of an electronic embodiment, such as the multipliers for FIG. 7. The control means or element can be mechanical, such as 11c of FIG. 5, or electronic, such as in FIG. 7. Other features and elements of the invention may also be implemented in either mechanical or electrical form, as will be apparent to one skilled in the art from the teachings herein.

FIG. 10 shows typical waveforms which would be seen for the circuit of FIG. 7. The waveforms of FIG. 10 are also similar to those of FIG. 9, except that the wiper rotation waveform 25 has been replaced with input pulse 29 and Ma-Md (20a-20d), the same as in FIG. 8. FIG. 10 shows input waveform 27 which is input to phase shift means 6e, and outputs 28a-28d corresponding to $\phi A$-$\phi D$. Output waveform 30 corresponds to the output from 21 It can be seen that the multipliers 17 and control element 23 essentially provide the same function as the circular resistive element and wiper shown in FIG. 4, thereby achieving the phase shift. The operation of FIG. 7 is essentially the same as that of FIG. 4, except that a given phase shifted signal (or portions of two phase shifted signals) is selected by a multiplier 17 in response to 23, whereas in the circuit of FIG. 4, the selection is provided by rotating the wiper. The phase of waveform 30 corresponds to $\phi D$ between time V and time W. AT time W, Md decreases and Ma increases, and the phase of 30 is the vector sum of $\phi A$ and $\phi D$. At time X, 30 has the same phase as $\phi A$. For the time period from Y to Z, the output 30 has a frequency shift. While signals Ma-Md have been shown as triangular in shape, other shapes will also work. It has been found that a half sinusoid shape works well in terms of minimizing distortion on the output signal. There is no requirement hat a complete transition from minimum to maximum be made within any given time and these signals may as well be caused to make only a partial change and then stop.

Although this invention has been described in its preferred form with a certain degree of particularity, it is understood that the present disclosure of the preferred form has been made only by way of example and that numerous changes in the details of construction and the combination and arrangement of parts may be resorted to as well as combinations of functions within or as part of other devices, without departing from the spirit and the scope of the invention as hereinafter claimed. Under the teachings of this invention, one skilled in the art will be able to combine various portions described with any of a number of known circuits or components to achieve substantially the same results.

What is claimed is:

1. An improvement for a selectable phase shifter incorporating an output and a plurality of inputs, one of which is an input signal and another which is coupled to a phase shifted input signal, the improvement comprising a further input coupled to a further phase shifted input signal, said signals having a different relative phases and a portion means having an adjustment capability, which portion means is coupled to the plurality of inputs and said further input and responsive to the signals thereof to linearly pass a portion of at least one of the signals to said output, which portions are responsive to said adjustment of said portion means.

2. The improved selectable phase shifter of claim 1 characterized in that said further phase shifted input signal is phase shifted by a different amount than the input signal or the phase shifted input signal.

3. The improved selectable phase shifter of claim 1 characterized by the addition of another input coupled to an even further phase shifted input signal and said portion means coupled to said another input coupled to an even further phase shifted input signal with said portion means operable such that said device may output a portion of said further phase shifted input signal and a portion of said even further phase shifted input signal so as to allow for an even further range of available phase shift.

4. The improved selectable phase shifter of claim 3 characterized in that said even further phase shifted input signal is derived directly from the input signal without substantial phase shift.

5. The improved selectable phase shifter of claim 3 characterized in that said even further phase shifted input signal is phase shifted 360 degrees with respect to the input signal.

6. The improved selectable phase shifter of claim 3 characterized by said portion means includes a control element operable such that the device may output a portion of said input signal and a portion of said even further phase shifted input signal so as to allow for a continuous available phase shift the equivalent of 360 degrees by said phase shifter.

7. The improved selectable phase shifter of claim 6 wherein said portion means includes a resistance element configured in a ring and having taps coupled to the input signal, the phase shifted, further phase shifted and even further phase shifted input signals which tap's are the aforementioned inputs.

8. The improved selectable phase shifter of claim 1 characterized in that said portion means includes a selectable resistance tap, and the output is coupled to said selectable resistance tap.

9. The improved selectable phase shifter of claim 8 characterized in that the selectable resistance tap is a mechanically movable resistance tap.

10. The improved selectable phase shifter of claim 8 characterized in that the selectable resistance tap is an electrically changeable resistance tap.

11. The improved selectable phase shifter of claim 1 wherein said portion means is controlled by an electrical signal.

12. The improved selectable phase shifter of claim 1 characterized in that the portions of the signals to the output are developed in a tapped delay line.

13. An improvement for a phase shifter incorporating an input signal and a phase shifted input signal having a different relative phase, characterized in that the input signal is coupled to a first multiplier means and said phase shifted input signal is coupled to a second multiplier means, said first multiplier means and said second multiplier means having a single common output, and operating to output a selectable phase shifted signal which is a combination which includes a first portion derived from said input signal and a second portion derived from said phase shifted input signal and control means to provide control signals to control said first multiplier means and said second multiplier means to selectively alter said first and second portions so as to provide for a selectable phase shifted signal at said common output, the phase of which changes in response to the amount of said portions.

14. The improved phase shifter of claim 13 characterized by said control means including a control voltage means connected to said first multiplier means and second multiplier means such that the signal applied to the multiplier is altered by the control voltage.

15. An improvement for a selectable phase shifter incorporating an output comprised of a movable tap coupled to a resistance element, Said element extending from a first fixed tap responsive to an input signal past a second fixed tap responsive to a phase shifted input signal to a third fixed tap responsive to another signal, said signals having different relative phases, the improvement comprising the resistance element extending in continuous fashion from the first fixed tap, past said second fixed tap, past said third fixed tap, back to said first fixed tap.

16. An improved selectable phase shifter for an input signal, said shifter comprising means to delay the input signal to provide a delayed input signal, an output, variable multiplier means for the input signal for providing a multiplied input signal as part of said output, second variable multiplier means for said delayed input signal for providing a multiplied delayed signal as part of said output, and means to control said variable multiplier and said second variable multiplier so as to produce a selectable phase shifted signal at said output.

17. Apparatus for providing a phase shifted version of an electronic signal, including in combination a phase shift means responsive to said electronic signal to provide three or more relatively phase shifted signals, one of which may be equivalent to said electronic signal, a impedance means having an output, an adjustment element and three or more terminals, with each of said terminals being operative to receive one of said phase shifted signals and providing a selectively variable impedance through said adjustment element between said terminals and said output, said adjustment element operating to selectively vary said impedances from a plurality of terminals to said output to allow a first portion of said output to be derived from one of said phase shifted signals in response to the aforementioned impedance through which said phase shifted signal flows and a second portion to be derived from a second of said phase shifted signals in response to the aforementioned impedance through which said second phase shifted signal flows which portions may include zero for one of the signals, and which portions are responsive to said adjustment element.

18. Apparatus as claimed in claim 17 wherein said impedance means includes a resistor with said adjustment element comprised of an adjustable tap on said resistor.

19. Apparatus as claimed in claim 17 wherein said impedance means is comprised of an electronic device which is coupled to pass any portion of any one or two phase shifted signals in response to said adjustment element.

20. Apparatus as claimed in claim 17 wherein said impedance means is response to at least four relatively phase shifted signals.

21. A resistive device having a resistance means with three or more receiving terminals configured to receive electronic signals all having different relative phases, and having an adjustment element controllable to provide an output signal at a further terminal which output signal includes one or a combination of two of the electronic signals which are applied to a given two of said receiving terminals, which combination is controlled by said adjustment element such that said device may pass any portion of one or two phase shifted signals to the output.

22. Apparatus as claimed in claim 21 wherein said resistance means has four or more receiving terminals configured to receive electronic signals.

23. Apparatus as claimed in claim 21 wherein said adjustment element is adjustable in a fashion such than said output may include a combination of portions of a first and a second of said electronic signals or a combination of portions of said second and a third of said electronic signals.

24. Apparatus as claimed in claim 21 wherein said resistance means is arranged in a continuous loop between said receiving terminals.

25. Apparatus as claimed in claim 21 wherein said resistance means is arranged in a circular fashion with said receiving terminals being arranged substantially equally spaced along said resistance means.

* * * * *

(12) EX PARTE REEXAMINATION CERTIFICATE (6898th)
United States Patent
Cooper

(10) Number: US 4,829,257 C1
(45) Certificate Issued: Jun. 30, 2009

(54) METHOD AND APPARATUS FOR CONTINUOUSLY SHIFTING PHASE OF AN ELECTRONIC SIGNAL

(75) Inventor: J. Carl Cooper, Sunnyvale, CA (US)

(73) Assignees: Pixel Instruments Corp., Los Gatos, CA (US); Technology Licensing Corporation, Walnut Creek, CA (US)

Reexamination Request:
No. 90/006,822, Oct. 16, 2003

Reexamination Certificate for:
Patent No.: 4,829,257
Issued: May 9, 1989
Appl. No.: 07/016,923
Filed: Feb. 20, 1987

(51) Int. Cl.
*H03K 3/00* (2006.01)
*H03K 12/00* (2006.01)
*H03H 7/00* (2006.01)
*H03H 7/20* (2006.01)

(52) U.S. Cl. .................. 327/237; 327/113; 327/231

(58) Field of Classification Search .................. None
See application file for complete search history.

(56) References Cited

U.S. PATENT DOCUMENTS

| 3,475,626 | A | | 10/1969 | Holzman | 327/238 |
| 3,725,772 | A | | 4/1973 | Ratzel | 323/213 |
| 4,290,022 | A | * | 9/1981 | Puckette | 327/241 |
| 4,431,969 | A | | 2/1984 | Summers et al. | 327/238 |
| 4,432,331 | A | * | 2/1984 | Yasuhara | 123/568.16 |
| 4,619,001 | A | * | 10/1986 | Kane | 455/192.3 |
| 4,737,842 | A | * | 4/1988 | Nagasaki | 348/30 |
| 5,943,206 | A | * | 8/1999 | Crayford | 361/103 |

FOREIGN PATENT DOCUMENTS

JP 57-176823 10/1982

* cited by examiner

*Primary Examiner*—Minh Nguyen

(57) ABSTRACT

An improved device for accurately phase or frequency shifting an input signal is disclosed incorporating a variable resistor extending between at least two known phase shifted values of said input signal.

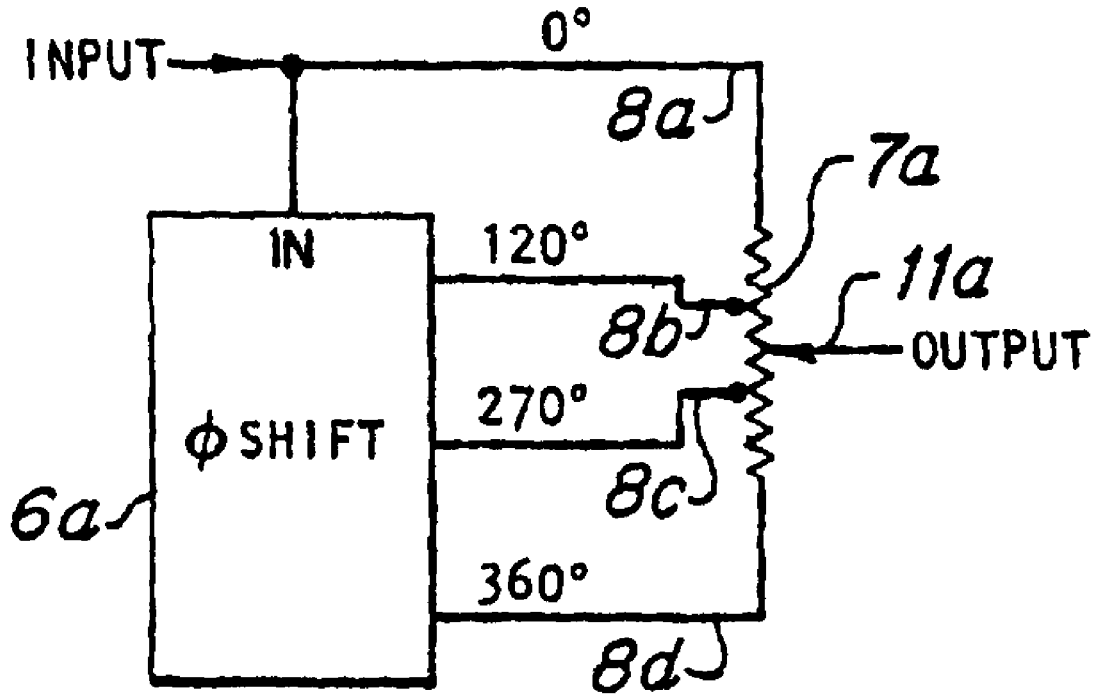

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claim 5 is confirmed.

Claims 1–4 and 6–25 are cancelled.

\* \* \* \* \*